United States Patent
Guo et al.

(10) Patent No.: US 8,255,757 B2
(45) Date of Patent: Aug. 28, 2012

(54) APPARATUS AND METHOD FOR ERROR CORRECTION IN MOBILE WIRELESS APPLICATIONS INCORPORATING ERASURE TABLE DATA

(75) Inventors: Scott Guo, San Jose, CA (US); Manikantan Jayaraman, San Jose, CA (US)

(73) Assignee: ST-Ericsson SA, Plan-les-Ouates (CH)

(*) Notice: Subject to any disclaimer, the term of this patent is extended or adjusted under 35 U.S.C. 154(b) by 904 days.

(21) Appl. No.: 12/067,073

(22) PCT Filed: Sep. 19, 2006

(86) PCT No.: PCT/IB2006/053380
§ 371 (c)(1),
(2), (4) Date: Nov. 7, 2008

(87) PCT Pub. No.: WO2008/038067
PCT Pub. Date: Apr. 3, 2008

(65) Prior Publication Data
US 2009/0177940 A1 Jul. 9, 2009

Related U.S. Application Data

(60) Provisional application No. 60/718,690, filed on Sep. 19, 2005.

(51) Int. Cl.
*G06F 11/00* (2006.01)
(52) U.S. Cl. ............ 714/752; 714/759; 714/799; 714/48
(58) Field of Classification Search ............ 714/48–52, 714/57, 704, 746, 752–760, 764–766, 786, 714/787, 795, 798
See application file for complete search history.

(56) References Cited

U.S. PATENT DOCUMENTS

| 5,224,106 A * | 6/1993 | Weng ............................. 714/755 |
| 2007/0240027 A1 * | 10/2007 | Vesma et al. .................. 714/759 |

FOREIGN PATENT DOCUMENTS

GB 2402307 A 12/2004
(Continued)

OTHER PUBLICATIONS

Joki, H; et al "Analysis of Reed-Solomon Coding Combined With Cyclic Redundancy Check in DVB-H Link Layer" Wireless Communication Systems, 2005. 2ND International Symposium on Siena, Italy, Sep. 5, 2005, pp. 313-317.

(Continued)

*Primary Examiner* — Scott Baderman
*Assistant Examiner* — Sarai Butler
(74) *Attorney, Agent, or Firm* — Potomac Patent Group PLLC

(57) ABSTRACT

A receiver (120) is configured to receive data over a communications link. A decapsulator (122) is coupled to the receiver and configured to create datagrams and erasure attributes associated with the datagrams. A decoder (124) is coupled to the decapsulator and configured to store the datagrams in a frame table (400) and to create codewords, the decoder storing the datagrams in table columns to create codewords in table rows, correcting the codewords, and configured to store the erasure attributes in an erasure table (552). The erasure table is characterized in that it comprises a plurality of entries (560), each of which is associated with a column of the frame table. Each entry is comprised of a plurality of elements (570).

12 Claims, 8 Drawing Sheets

FOREIGN PATENT DOCUMENTS

| | | |
|---|---|---|
| GB | 2407946 | 5/2005 |
| GB | 2 415 873 | 1/2006 |
| JP | 2009509480 | 3/2009 |
| WO | 2004079982 A1 | 9/2004 |
| WO | 2004086670 A1 | 10/2004 |
| WO | 2006/085326 | 8/2006 |
| WO | 2006/125157 | 11/2006 |
| WO | 2008/038067 | 4/2008 |

OTHER PUBLICATIONS

De Diego Balaguer, E; et al "Performance Evaluation of Power Saving Strategies for DVB-H Services Using Adaptive MPE-FEC Decoding" Personal, Indoor and Mobile Radio Communications, 2005. IEEE 16TH International Symposium on Berlin, Germany, Sep. 11, 2005, pp. 2221-2226.

Koppelaar, A G C; et al "Restoration of IP-Datagrams in the DVB-H Link-Layer for TV on Mobile" Consumer Electronics, 2006. ICCE '06. 2006 Digest of Technical Papers. Jan. 7, 2006, pp. 409-410.

Eerenberg, O; et al "IP-Recovery in the DVB-H Link Layer for TV on Mobile" Consumer Electronics, 2006. ICCE '06. 2006 Digest of Technical Papers. Jan. 7, 2006, pp. 411-412.

Joki, H. "Modeling of DVB-H Link Layer," Internet Citation, Online, May 10, 2005, XP002389192, URL: http://www.netlab.tkk.fi/opetus/s38310/04-05/Kalvot_04-05/Joki_100505.ppt.

* cited by examiner

APPARATUS AND METHOD FOR ERROR CORRECTION IN MOBILE WIRELESS APPLICATIONS INCORPORATING ERASURE TABLE DATA

Wireless environments provide a challenge for high quality communication. The invention relates to techniques for improving error correction in mobile wireless applications while reducing memory, computational and power consumption requirements.

Advances in semiconductor manufacturing technologies and digital system architectures have resulted in very highly integrated circuits, which contain millions of transistors, along with various other components and interconnections. The integrated circuits that result from the aforementioned advances provide significant computational resources at relatively low costs. In turn, the availability of such integrated circuits has given rise to growth in the capabilities and varieties of consumer electronic products, and particularly mobile wireless products. One particular aspect of consumer electronic products is mobile and portable TV receivers.

Because of the ever-increasing demand for improved reception quality, more and more complex technologies have been employed in state-of-the-art mobile and portable TV receiver products that incorporate, or include, error correction functionality, or capability. Use of these complex technologies often results in undesirable consequences in terms of both cost and power consumption. For example, such signal processing capabilities typically require a large amount of memory in which to store input data, and further typically require fast computational resources. The extra memory and the high speed computational resources add to the cost and the power consumption of the products into which the error correction capabilities are incorporated.

The required amount of memory has become particularly large in some of the sophisticated processing algorithms that operate on large amount of input data and produce several output data, including intermediate results, which are stored for subsequent processing.

What is needed are methods and apparatus for providing error correction capabilities while reducing the cost and power consumption of products in which such capabilities are incorporated.

The invention provides an apparatus and method for improving the quality of reception in wireless devices.

A receiver is configured to receive data over a communications link. A decapsulator is coupled to the receiver and configured to create datagrams and erasure attributes associated with the datagrams. A decoder is coupled to the decapsulator and configured to store the datagrams in a frame table and to create codewords, the decoder storing the datagrams in table columns to create codewords in table rows, correcting the codewords, and configured to store the erasure attributes in an erasure table. A user interface is coupled to the decoder and configured to render images corresponding with corrected datagrams on the user interface. Advantages of the invention include the improve signal reception and processing, and prolong battery life in mobile wireless devices.

In one aspect of the invention, the erasure table includes a plurality of entries each of which is associated with a column in the frame table, wherein each of the entries includes a plurality of elements, wherein each of the elements includes a plurality of fields that store the erasure attributes associated with the datagrams. In one aspect of the invention, the decapsulator is configured to generate at least three levels of erasure attributes associated with the datagrams, and the erasure table elements are configured to store at least three levels of erasure attributes associated with the datagrams. In one aspect of the invention, the device includes a pointer table configured to identify a location of an element of an entry in the erasure table. In one aspect of the invention, the device includes an erasure generator including a plurality of comparators coupled to a selector and configured to generate an erasure assignment for each entry in the erasure table. In one aspect, the communications link is a wireless link and the data is digital television data.

Advantages of the invention include improved signal reception and signal processing, and prolonged battery life in mobile wireless devices.

The invention is described with reference to the following figures.

Figure 3A:
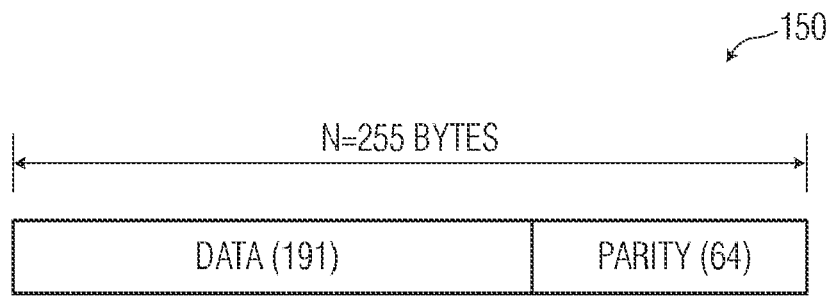
FIG. 3A depicts a Reed-Solomon codeword according to an embodiment of the invention.
Figure 3B:
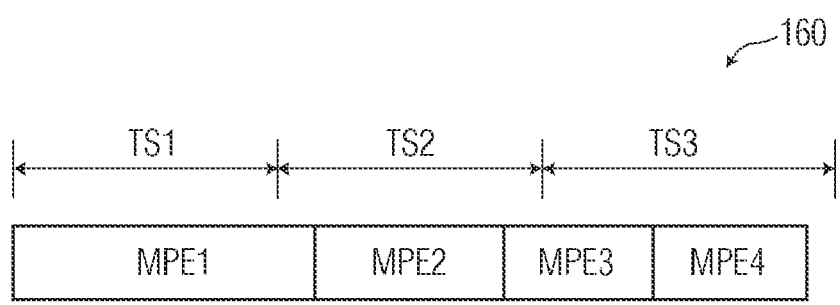
Figure 3C:
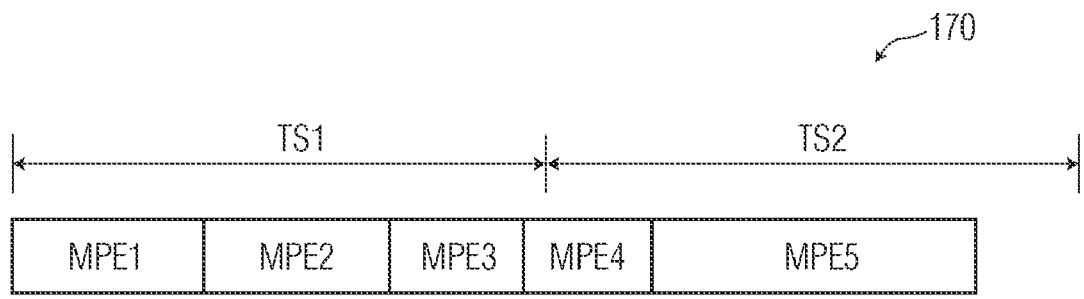

FIG. 3B-C depict the relationship between the transport packets and the MPE-FEC sections according to an embodiment of the invention.

Figure 4A:
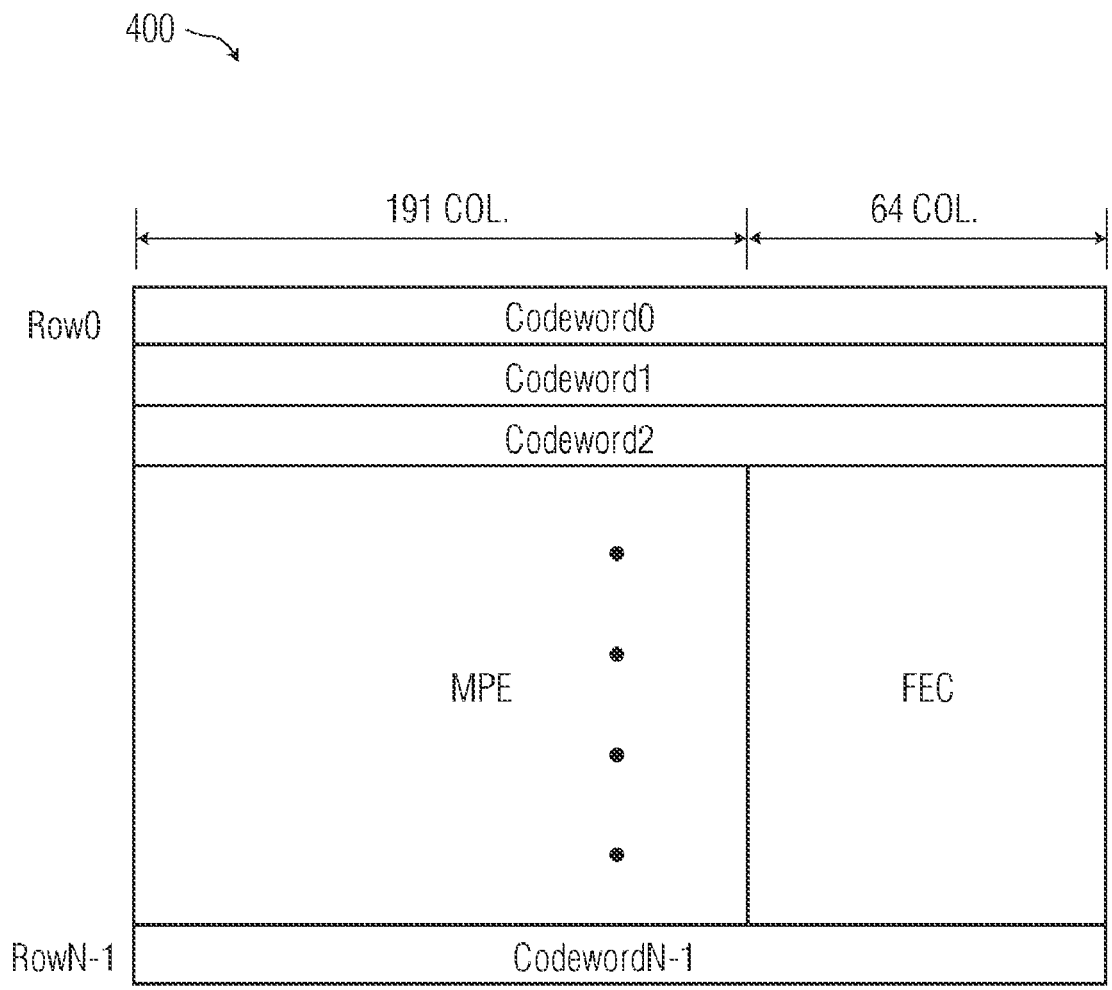
Figure 4B:
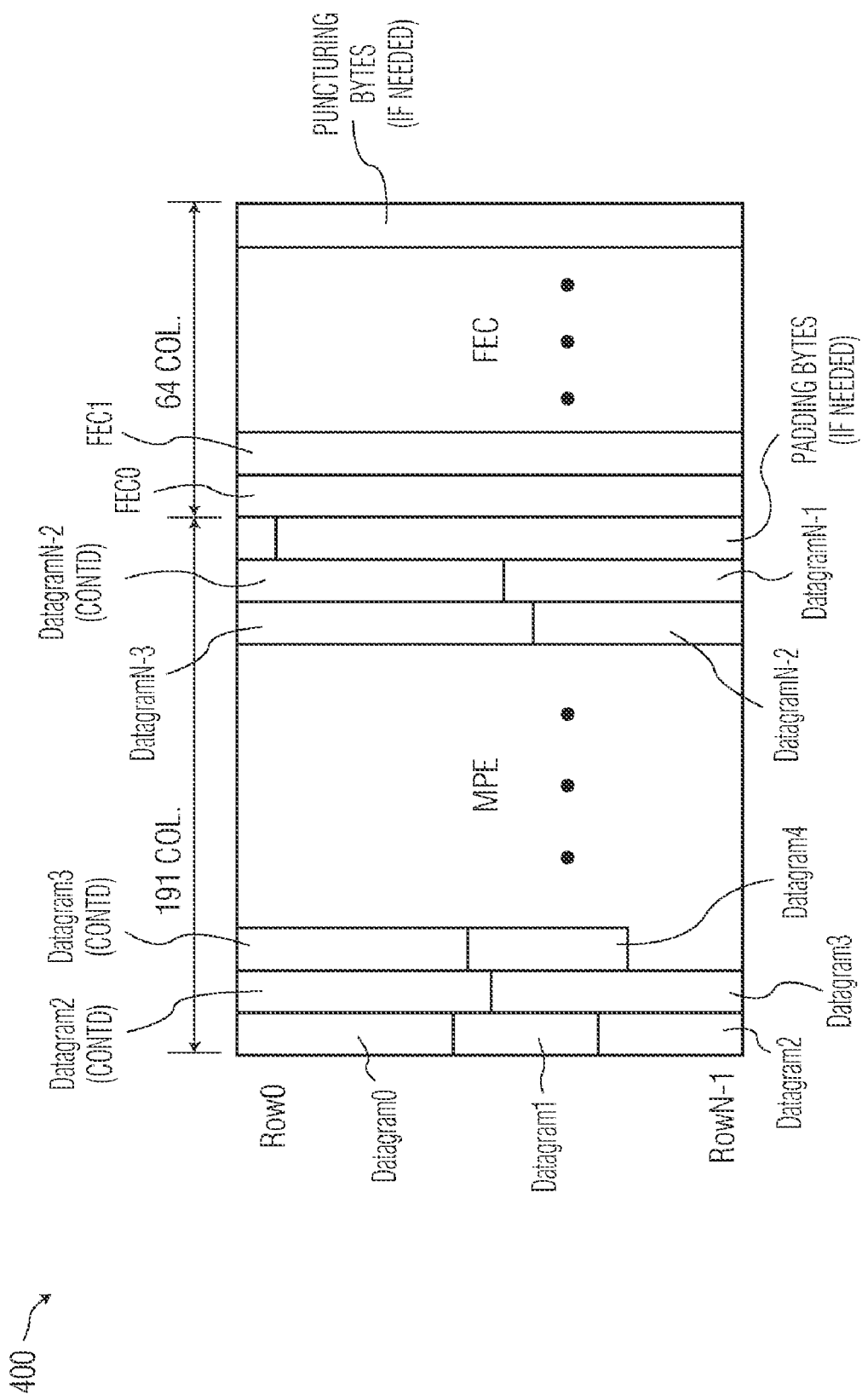

FIGS. 4A-B depict a memory table according to an embodiment of the invention.

Figure 5:
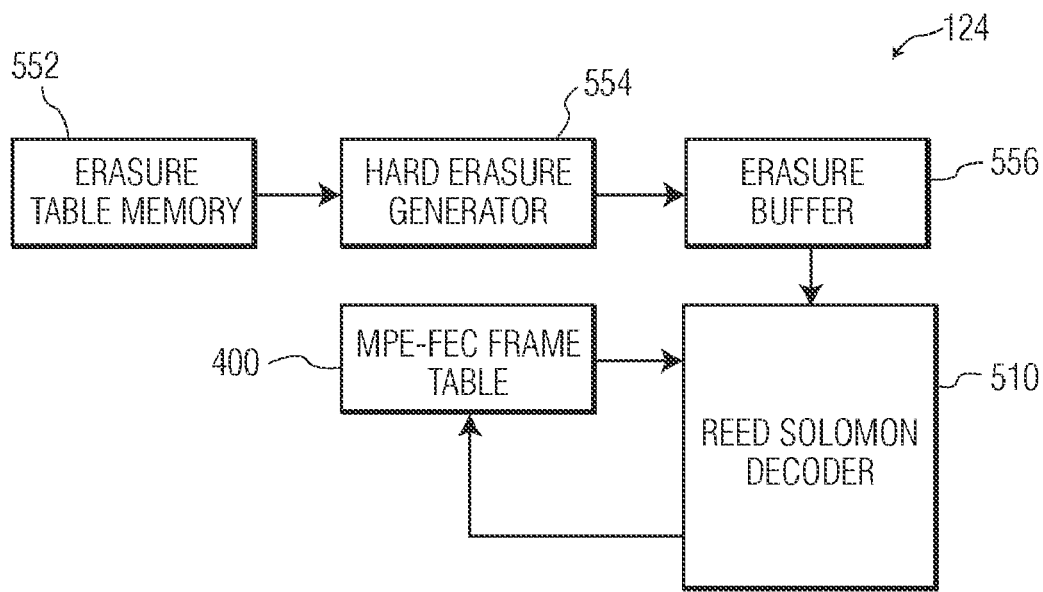

FIG. 5 depicts a logical architecture of the adaptive MPE-FEC decoder according to an embodiment of the invention.

FIGS. 6A-D depict an erasure table according to an embodiment of the invention.

Figure 7:
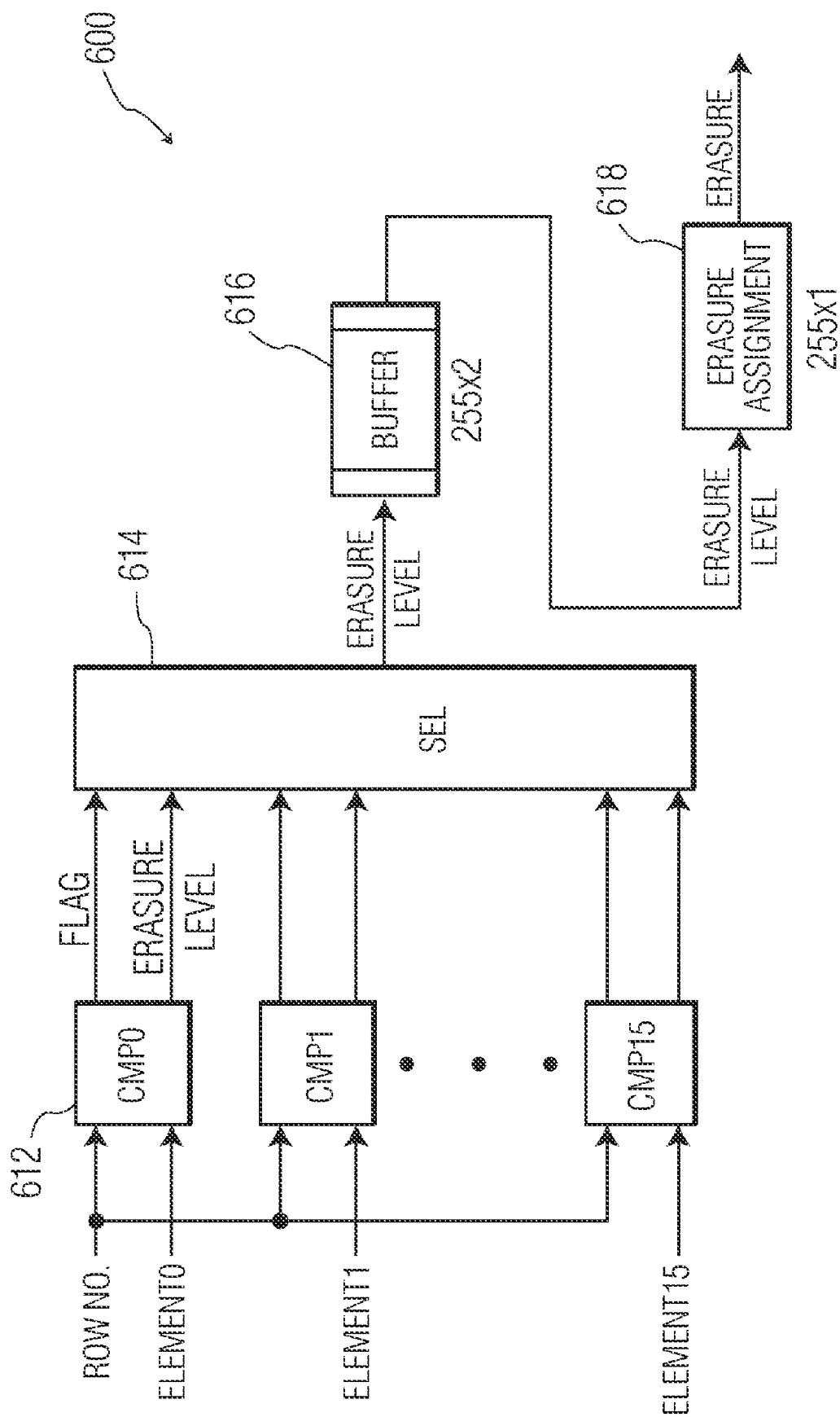

FIG. 7 depicts an erasure generator according to an embodiment of the invention.

The invention is described with reference to specific embodiments. Those skilled in the art will recognize that the description is for illustration and to provide the best mode of practicing the invention. While references are made to specific wireless devices and protocols, the invention is applicable to many different types of communication mediums, devices and protocols. For example, while a wireless protocol is described herein, the invention is applicable to other protocols and communication techniques such as wireline communication, as well as analog and digital variations. Likewise, while Reed-Solomon error correction is described, other error correction techniques can be implemented in the invention. Additionally, while specific parameters such as packet size and memory size are described here, these are for purposes of example only since the invention may be used with other packet sizes, memory sizes, and so forth.

Memory storage requirements for digital signal processing operations are reduced significantly in the present invention by incorporating a special erasure table to represent the erasure information. Instead of specifying the erasure information for each symbol (or byte) of the codeword separately, the erasure table allows the erasure information for a number of symbols to be represented by a single entry, or instance, of the data structure. This allows the table to substantially share the same memory space among many symbols. A technique is further introduced for translating the data structure into erasure information associated with individual symbols during a decoding operation.

Figure 1:
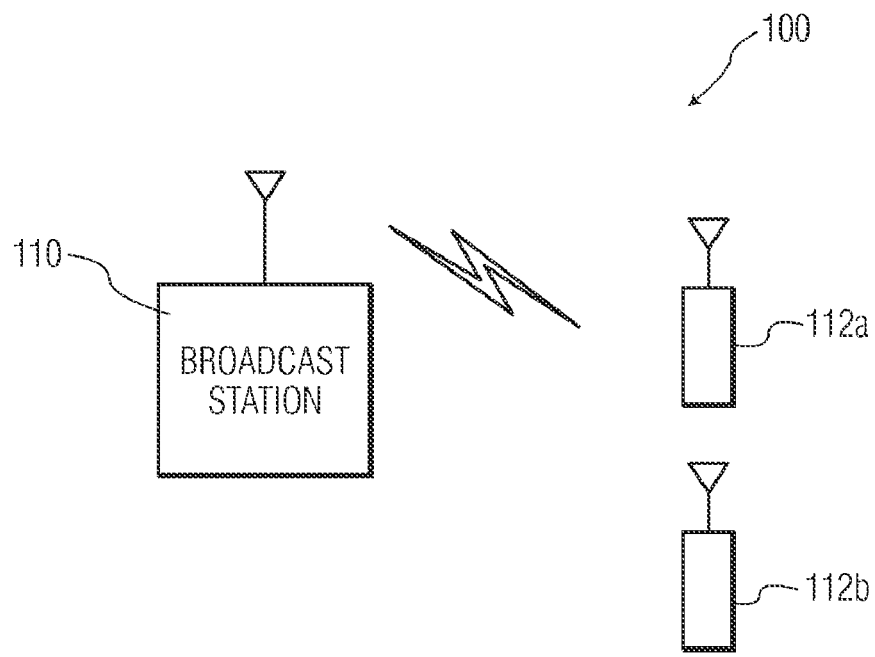
FIG. 1 depicts an exemplary wireless network according to an embodiment of the invention.

FIG. 1 depicts an exemplary wireless network 100 showing a broadcast station 110 and a number of wireless devices 112a-112b receiving a signal from the broadcast station. These devices have the ability to communicate with one another. The devices 112a-112b are, for example, television receivers, but could also be other mobile devices such as telephones, personal digital assistants (PDAs), laptop computers or other electronic devices. Moreover, some of these devices may be on battery power while others may be powered by an available power outlet. In some cases, the devices can also be connected to the network through a wired network e.g. Ethernet or cable connection.

Figure 2A:
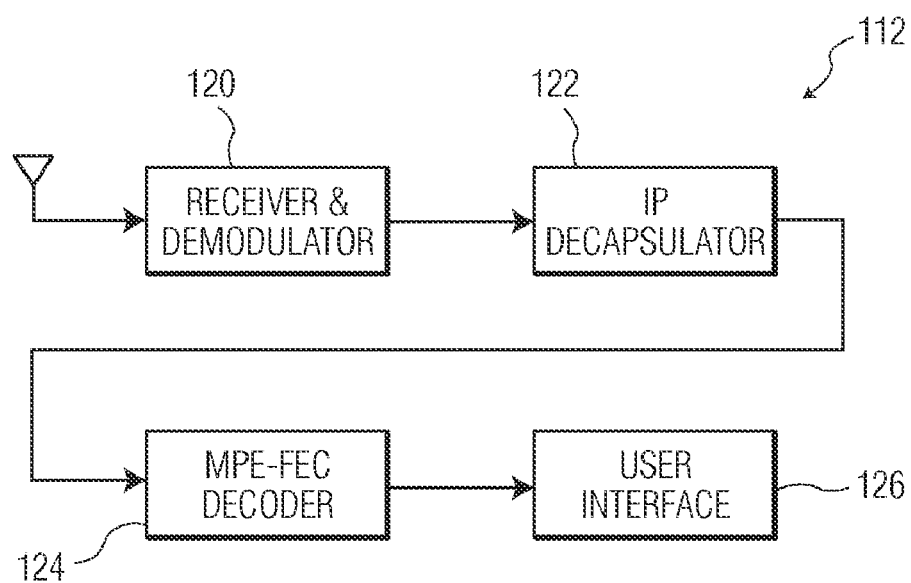
FIG. 2A depicts an exemplary device according to an embodiment of the invention.
Figure 2B:
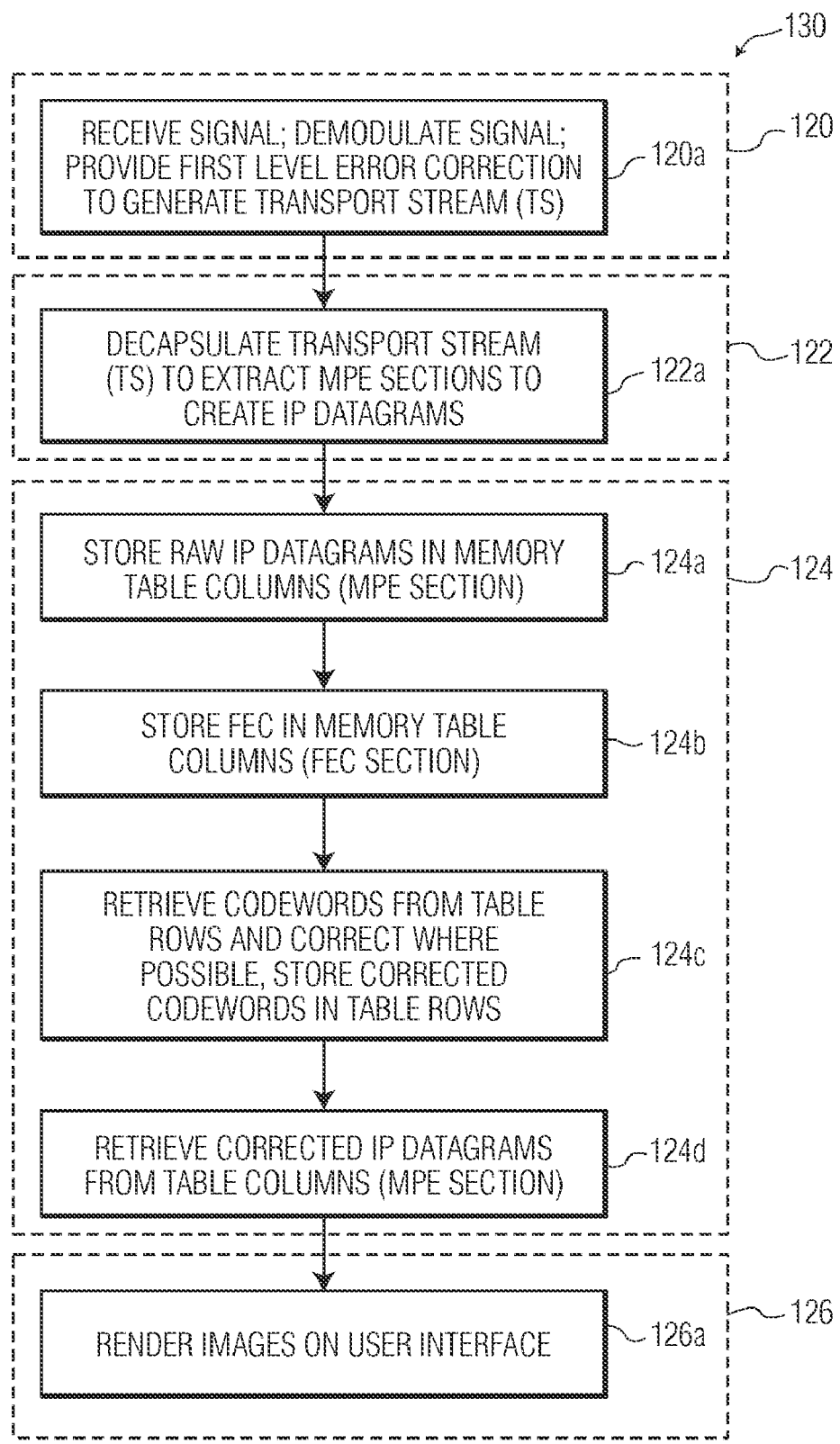
FIG. 2B depicts a flowchart showing methods performed in the exemplary device according to an embodiment of the invention.

FIG. 2A depicts an exemplary device 112 according to an embodiment of the invention. FIG. 2B depicts a flowchart showing methods performed in the exemplary device. A receiver and demodulator 120 receives an inbound signal, transforms the signal to a lower frequency, and creates a Transport Stream to make the signal available for processing. In one aspect, the receiver includes an error correction circuit that performs initial error correction on the demodulated packets and sets a Transport Error Indicator (TEI) if the TS packet is bad and cannot be corrected. An IP Decapsulater 122 performs initial processing on transport packets by decoding the inbound information into multi-protocol forward error correction (MPE-FEC) sections along with erasure information and parsing through the MPE-FEC sections to extract the raw IP datagrams. An MPE-FEC decoder 124 receives the MPE-FEC sections and processes the Reed-Solomon codewords according to embodiments of the invention, resulting in corrected IP datagrams. A user interface 126, e.g. source decoding and rendering circuit, processes the information for display on a user interface, e.g. television display.

For error correction, an exemplary embodiment uses Reed-Solomon codes. A Reed-Solomon encoder takes a block of digital data and adds extra "redundant" bits. Errors occur during transmission or storage for a number of reasons (for example noise or interference, scratches on a CD, etc). The Reed-Solomon decoder processes each block and attempts to correct errors and recover the original data. The number and type of errors that can be corrected depends on the characteristics of the Reed-Solomon code.

A Reed-Solomon code is specified as RS (n, k) with s-bit symbols. This means that the encoder takes k data symbols of s bits each and adds parity symbols to make an n symbol codeword. These are n–k parity symbols of s bits each. A Reed-Solomon decoder can correct up to t symbols that contain errors in a codeword, where 2t=n–k.

FIG. 3A depicts a Reed-Solomon codeword according to an embodiment of the invention. The Reed-Solomon codes used in the MPE-FEC is specified as RS (255, 191) with 8-bit symbols. This means that each codeword contains 255 code word bytes, of which 191 bytes are data and 64 bytes are parity. That is: n=255, k=191, s=8, 2t=64 and t=32. The decoder can correct any 32 symbol errors in the code word: i.e., errors in up to 32 bytes anywhere in the codeword can be automatically corrected. Given a symbol size s, the maximum codeword length n for a Reed-Solomon code is n=2s−1. For example, the maximum length of a code with 8-bit symbols (s=8) is 255 bytes. The amount of processing power required to encode and decode Reed-Solomon codes is related to the number of parity symbols per codeword. A large value of t means that a large number of errors can be corrected but requires more computational power than a small value of t. One symbol error occurs when any number of bits in a symbol are wrong.

Reed-Solomon algebraic decoding procedures can correct errors and erasures. An erasure occurs when the position of an erred symbol is known. A decoder can correct up to t errors or up to 2t erasures. In the exemplary embodiment, erasure information is estimated and manipulated to assist in identifying received symbols that are likely to contain errors. When a codeword is decoded, if 2x+y<2t (x errors, y erasures) then the original transmitted codeword can be recovered.

It is noted that the more erasures are known, the more errors can be corrected. Therefore, it is desirable that as many erasure as possible (up to 64, of course) can be identified prior to Reed-Solomon decoding. On the other hand, if symbols are wrongly marked as erasures, it will reduce the number of errors that Reed-Solomon decoder can correct. For example, suppose that there are 8 erasures, of which 6 are not error codes and are hence wrongly identified as erasures. The Reed-Solomon decoder can only correct (64−8)/2=28 errors and 2 erasures. On the other hand, if there are only 2 erasures identified in the first place, Reed-Solomon can then correct (64−2)/2=31 errors and 2 erasures. Therefore, it is desirable to provide a sound algorithm to reliably mark erasures.

FIGS. 3B-C depicts the relationship between the transport packets and the MPE-FEC packets according to an embodiment of the invention (not to scale). The formats for the transport stream (TS) packet and the datagram section are shown in Table 1 and Table 2, respectively. Note in FIG. 3A that there does not need to be a direct correspondence between the TS packet and the MPE packet, and an MPE packet can cross the boundary between one or more TS packets. One aspect of the invention is how to reconcile and reconstruct the MPE-FEC frame table 400 shown in FIG. 4A under all conditions.

TABLE 1

Transport packet format (in the order in which they appear in the transport packet. The first row, i.e. sync byte occurs first).

| Name | Number of bits | Description |
| --- | --- | --- |
| Sync byte | 8 | Fixed value of 0x47. |
| Transport error indicator (TEI) | 1 | A value of '0' indicates no error. A value of '1' indicates that at least 1 bit error in the transport packet. |
| Payload unit start indicator (PUSI) | 1 | A value of '1' indicates there is at least an MPE section header in the payload of this transport packet. A value of '0' indicates there is no MPE section header in the payload of this transport packet. |
| Transp. priority | 1 | |
| PID | 13 | 0x0000: PAT; 0x0001: CAT; 0x0010-0x1FFFE: network, program map-, elementary- PID or other. 0x1FFF: null. |
| Transport scrambling control | 2 | 00 |
| Adaptation field control | 2 | 00: reserved; 01: no adapt field, payload only; 10: adapt field only, no payload; 11: adapt field and payload. |
| Continuity counter | 4 | |
| Adaptation field | 0 or 8 | Adaptation + stuffing |
| Payload | 183 or 184 | PES packets or PSI sections or packet stuffing bytes or private data. |

TABLE 2

MPE section format.

| Name | Number of bits | Description |
| --- | --- | --- |
| Table ID | 8 | 0x3E indicates DSM CC section with private data (table 9-3 in ISO/IEC 138 18-6) |
| Section syntax indicator | 1 | 1: presence of CRC_32 field. |
| Private indicator | 1 | 0 |
| Reserve | 2 | 11 |
| Section length | 12 | The number of remaining bytes in the MPE section immediately following this field up to the end of the MPE section. |
| MAC address (bytes 6 and 5) | 16 | |
| Reserve | 2 | |
| Payload scrambling control | 2 | 00 |
| Address scrambling control | 2 | 00 |
| LLC SNAP flag | 1 | A value of '0' indicates that section carries an IP datagram without LLC SNAP encapsulation (mandated by IP datacast docs) |
| Current next indicator | 1 | Always 1. |
| Section number | 8 | 0: no fragmentation of payload over multiple MPE sections 1 . . . 255: fragment sequence number. |
| Last section number | 8 | Sequence number of the section carrying the last payload fragment. |
| MAC address (bytes 4 to 1) | 32 | |
| Data payload (IP datagram) | | |
| Section stuffing bytes | | |
| CRC_32 | | |

FIGS. 4A-B depict a memory frame table 400 according to an embodiment of the invention. The memory table includes a number of columns corresponding to the length of the desired codeword, which in this case is N=255 Bytes. The table includes a number of rows corresponding with the desired size of the table in memory.

The MPE-FEC frame table, which stores the input data of the MPE-FEC decoder, is structured as a matrix with 255 columns and a flexible number of rows. In one embodiment designed for the digital television DVB-H (digital video broadcasting-handhelds) transmission parameter signaling (TPS), the maximum allowed value for no_of_rows (RowN) is 1024, which makes the total MPE-FEC frame size almost 2 M bits.

Each position in the matrix hosts an information byte. The last part of the MPE-FEC frame, consisting of the 191 leftmost columns, is dedicated for IP datagrams and possible padding, and is called the application data table. The right part of the MPE-FEC frame, consisting of the 64 rightmost columns, is dedicated for the parity information of the FEC code and is called the Reed-Solomon (RS) data table. Each byte position in the application data table has an address ranging from 0 to 191×RowN. In the same way, each byte position in the RS data table has an address ranging from 0 to 64×RowN.

FIG. 4A shows an MPE portion and a FEC portion of the memory 400 for each codeword to be reconstructed by the invention. FIG. 4B shows how the IP datagrams are received and compiled into columns of the frame table 400.

As IP datagrams are extracted, they are introduced datagram-by-datagram, starting with the first byte of the first datagram in the upper left corner of the matrix and going downwards to the first column. The length of the datagram may vary arbitrarily from datagram to datagram. Immediately after the end of one datagram the following datagram starts. If a datagram does not end precisely at the end of a column, it continues at the top of the following column. When all datagrams have entered the application data table, any unfilled byte positions are padded with zero bytes, which make the leftmost 191 columns completely filled.

After all the leftmost 191 columns filled, the 64 parity bytes are filled to the MPE-FEC frame. The code used is Reed-Solomon RS (255, 191). Each row of the MPE-FEC table then contains one RS codeword. Some of the rightmost columns of the RS data table may be discarded and hence not transmitted, to enable puncturing, as shown in FIG. 4C. The exact number of punctured RS columns does not need to be explicitly signaled and may change dynamically between frames. With this also the RS data table is completely filled and the MPE-FEC frame is completed.

The MPE portion can include padding bytes that are transmitted in the TS to fill the portion of the table, which may occur at a variable length since the MPE section lengths are variable. The FEC section packets are normally full length since they are intended to be inserted into the FEC portion of the table as efficiently as possible. The FEC portion can include puncturing bytes, which are not transmitted, to fill the FEC portion of the table.

Regarding Erasures, the Reed-Solomon encoding RS (255, 191), which is the exemplary MPE-FEC decoding function specified by the DVB-H standard, can correct up to 32 errors in a 255 bytes codeword. If erasures are provided, however, RS (255, 191) can correct up to 64 erasures. Erasures indicate which bytes of the codeword are considered erroneous. Therefore, using erasure attributes can substantially increase the error correction capability of Reed-Solomon decoder.

Since MPE-FEC decoding begins when the MPE-FEC frame table 400 is filled, a memory of at least 2 Megabits is used in the exemplary embodiment to store the MPE-FFEC frame data alone, but other sizes may be used. If a handover function is supported, the MPE-FEC frame data memory size is doubled.

To store erasure information for each byte of the codeword in the MPE-FEC frame, a straightforward or conventional method stores at least 1 bit ('0' indicates non-erasure and '1' indicates erasure) for each byte of the codeword. That means, for the erasure table, a memory size of 255×1024 bits=255 K bits is used at the minimum. 510 K bits of memory is used if two bits are used (in order for erasure pre-processing as described later) to represent the erasure for each byte of the codeword. Again, if a handover function is supported, the amount of memory is doubled for the erasure table.

FIG. 5 depicts a conceptual level structure of the MPE-FEC decoder 124 that includes a RS decoder 510, an MPE-FEC frame table 400, an erasure table memory 552, an erasure generator 554 and an erasure buffer 556. MPE-FEC frame table is stored in a memory that provides the RS decoder with input codeword bytes and stores the corrected codewords from the RS decoder. The erasure information is stored in the erasure table memory. During the RS decoding process, the erasure generator takes the erasure information that is coded in 2 bits for each byte of the codeword. It then maps the 2 bits into 1-bit erasure and stores it in the erasure buffer. The erasure buffer contains erasures for a complete codeword.

In one aspect, the size of the erasure table memory is reduced by introducing a special form of data structure to represent the erasure information. Instead of representing the erasure information for each byte of the codeword separately, the data structure allows the erasure information of a large number of bytes to be represented by a single instance of the data structure, also known as element as described in the following section, to substantially share the same memory space among many bytes. The erasure generator then translates the data structure into erasure information for each individual byte that is required during MPE-FEC decoding operation.

In one aspect, the decapsulator is configured to generate at least three levels of erasure attributes associated with the datagrams as shown in Table 3, which results in 2 bit erasure attributes. In this aspect, the decoder may be configured to selectively process codewords to create corrected codewords, wherein the selection is based at least in part on the attributes stored in the erasure table. Again, the decoder may be configured to selectively bypass codewords that the erasure table identifies as correct or having too many errors to correct. In this aspect, a concept of soft-erasures is introduced. A soft-erasure describes the likelihood of a symbol in a codeword being erroneous.

The soft-erasure value of each symbol in the codeword can be extracted, for example, from the received transport packet. For instance, if the TEI (transmission error indicator) bit of the transport packet is set to 1, the soft-erasure value of the payload in the transport packet can be assigned to 2, while the soft-erasure value is assigned to 1 if the TEI bit is set to 0. For padding bytes of the MPE application data table, or payload of the transport packets that pass CRC (cyclic redundancy checksum) check, for example, a soft-erasure value of 0 is assigned. For puncturing bytes of the MPE-FEC Reed-Solomon data table, for example, a soft-erasure value of 3 is assigned.

These examples show how the soft-erasure values may be determined. Other scenarios are possible for the soft-erasure value. For instance, the continuity count bits of a transport packet can be used to determine whether there are any packets dropped. In case a packet is dropped, the soft-erasure value of the whole packet can be assigned to 3, as it is certain that all symbols are erroneous.

While there are a number of techniques to construct the soft-erasure table, it is useful that the table be constructed in such a way that hard-erasures can be generated for each codeword and to minimize the table size. A simplified hard-erasure generator and small soft-erasure table translate to reduced cost and power consumption.

In one aspect of the current invention, hard-erasures are generated after the MPE-FEC frame is completely constructed and the soft-erasure table is filled. Hard-erasure value is binary. When its value is 1, it indicates the current symbol of the codeword is an erasure. When its value is 0, it indicates that the current symbol of the codeword is not an erasure. The hard-erasure is subsequently used by the Reed-Solomon decoder. The present invention, however, is not limited to a specific Reed-Solomon decoder implementation.

The hard-erasure generator is normally related to how the soft erasure table is constructed. In one aspect of the current invention, the hard-erasure generator produces hard-erasures for one complete codeword per execution. At the end of an execution, the hard-erasure generator determines that no Reed-Solomon decoding is necessary if either of the following conditions is met: (a) the hard-erasure of every symbol in the codeword is 0; or (b) the number of symbols whose hard-erasure is 1 exceeds the limitation of the Reed-Solomon decoder, i.e. 64 in the case of DVB-H. Normally, the first condition is met if and only if the soft-erasures of all symbols in a codeword are 0, and the second condition is met if and only if the soft-erasures of at least 65 (in the case of DVB-H) symbols in a codeword are not 0.

Note that the present invention also works with Reed-Solomon decoding that does not use erasures. In that case, the sole function of the hard-erasure generator is to determine whether or not Reed-Solomon Decoding is required. No hard-erasures are output to the Reed-Solomon decoding sub-module.

Figure 6A:
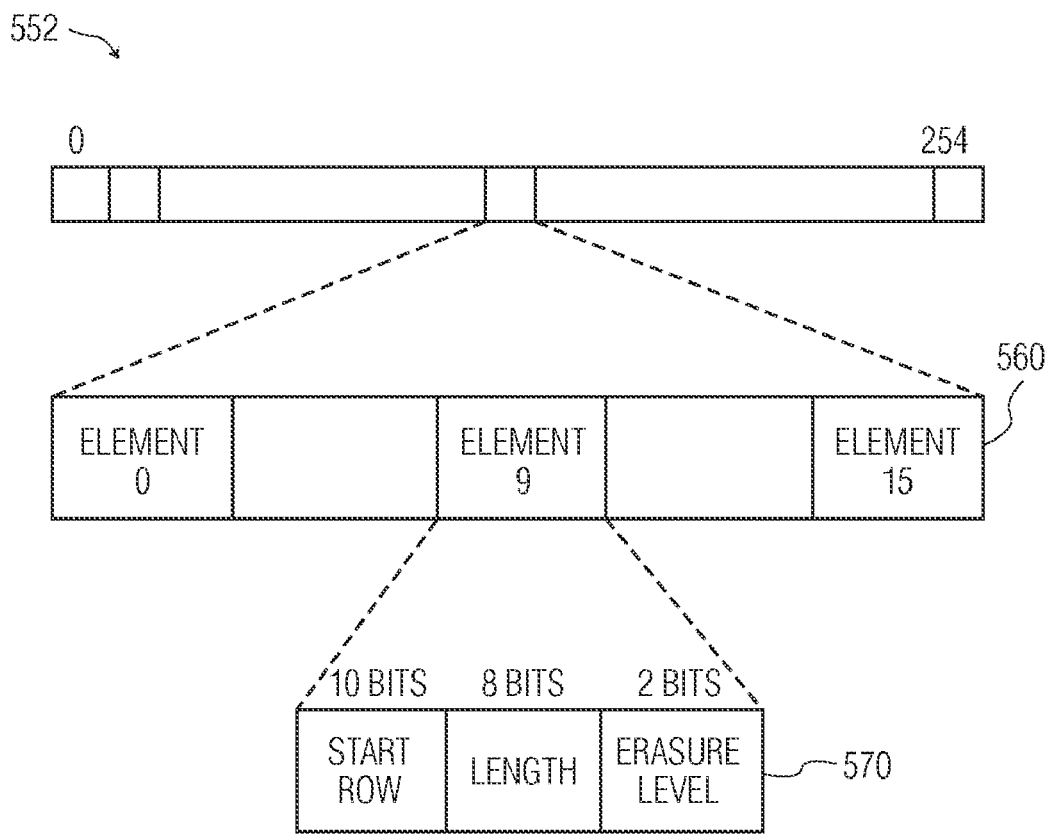

FIG. 6A depicts an erasure table according to an embodiment of the invention. In one aspect of the invention, the decapsulator is configured to generate erasure attributes associated with the IP datagrams and the decoder is configured to store the erasure attributes in an erasure table. The decoder may be configured to selectively process codewords to create corrected codewords, wherein the selection is based at least in part on the attributes stored in the erasure table.

As IP datagrams are decapsulated from the incoming transport stream packets, erasure information is extracted. The erasure table is implemented to store the erasure information for a whole MPE-FEC frame.

The arrangement of the erasure table is shown in FIG. 6A. The erasure table 550 includes of 255 entries. Each of the entries is associated with a column in the MPE-FEC table as shown in FIG. 4A. That is, entry 1 is associated with column 1 of MPE-FEC table; entry 2 is associated with column 2 of MPE-FEC table and so on.

Each entry of the erasure table is composed of 16 elements 560. The reason for choosing this number in the exemplary embodiment is given the size of the smallest IP packet is equal to 40 bytes, a column can contain up to 26 IP packets. Assuming that every other IP packet received is unreliable (i.e., CRC error in the IP packet), 13 erasure elements are used for each erasure table entry, or for each column of the MPE-FEC table. Considering elements that are required to modify the erasure level stored with a previous entry due to TEI=1, 16 elements should be sufficient for a column.

Each element of the erasure table entry includes of 3 fields 570: a 10-bit of row start address, an 8-bit length and a 2-bit erasure level value. When the exemplary embodiment is implemented as memory, the erasure table has a size of 20 bits×16×255=81600 bits.

Both the row and column numbers of the MPE-FEC table starts from 0 as specified by the standard. Assuming that the start location of an MPE-FEC packet is X, its start row number is the remainder of (X/(total number of rows of the MPE-FEC table)), and its start column number is the quotient of (X/(total number of rows of the MPE-FEC table)). The column number will be the entry number of the erasure table.

Figure 6B:
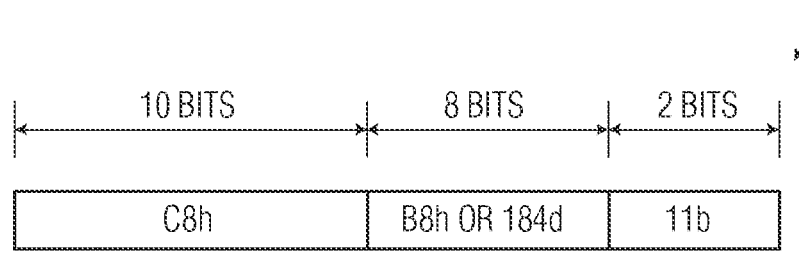

FIG. 6B depicts an example, if the total number of row of the MPE-FEC table is 1024 and if a transport stream packet with TEI=1 and containing only one IP datagram is received that is assumed to be put at location 200, then the start row number is 200, i.e. C8 in hex and column number is 0. The corresponding element is thus put in the first entry of the erasure table, with the content as shown in FIG. 6A. In this case the erasure level is 11b.

Figure 6C:
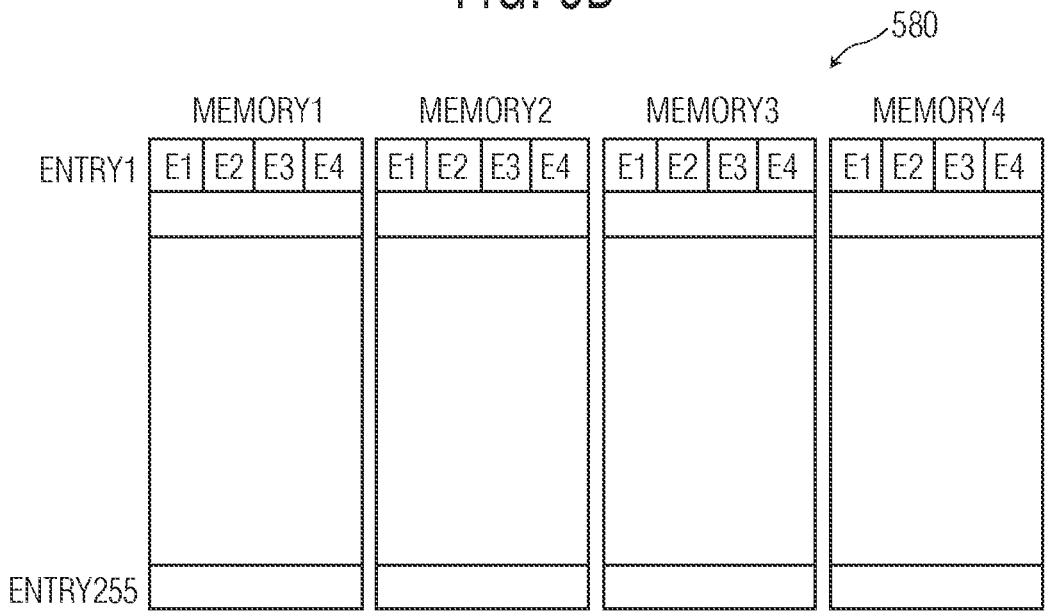

If implemented in one memory, the port width of the erasure buffer would be 320 bits. This is not a good aspect ratio with the current technology. It is therefore proposed to perform table mapping and implement the erasure table with 4 memories, each with a size of 255×80 bits. Each entry of the erasure table is equally distributed and stored respectively in the four memories: the first four elements are stored in the first memory; the second four elements are stored in the second memory and so on. The layout is shown in FIG. 6C.

The erasure table is filled in such a way that an element is created only when an unreliable IP datagram is received; no entry is created for an IP datagram that is decided reliable.

Figure 6D:
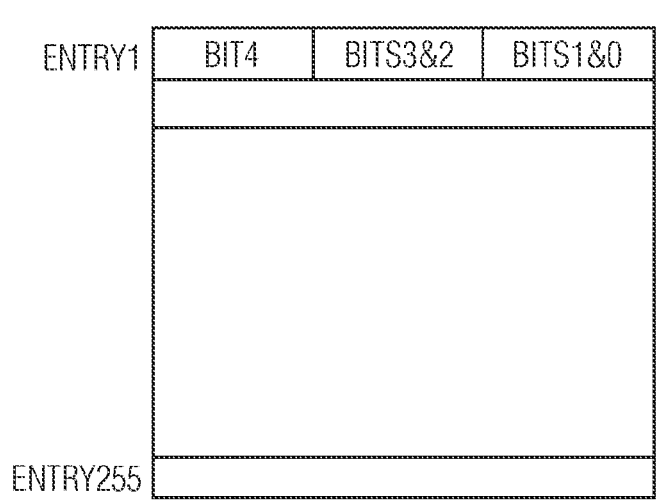

Therefore, if there is no unreliable IP datagram occurring for a whole column, there will be no element at all for the corresponding entry in the erasure table. And of course, there are cases that only some of the elements are valid. Therefore, one aspect of the invention marks which element is valid in an entry. FIG. 6D depicts a pointer table 590 for this purpose.

As shown in FIG. 6D, the pointer table 590 includes 255 entries: each corresponding to an entry in the erasure table. An entry includes of 5 bits and is defined as in Table 4. These 5 bits are used to decide where to write the next element of the entry in the erasure table.

TABLE 4

Definition of a pointer table entry.

| Bits | Description |
|---|---|
| 4 | A value of 0 indicates that there is no valid element in the corresponding entry of the erasure table, so the next element should be written to the erasure table at the location for the first element of the entry in the first memory.<br>A value of 1 indicates that there is at least one valid element in the corresponding entry of the erasure table, so the next element should be written next to the one that has been written last. |
| 3:2 | If bit 4 of the entry is 1, these two bits indicate which memory to be written on the next write.<br>When bits [3:2] = 00, it indicates memory 1;<br>When bits [3:2] = 01, it indicates memory 2;<br>When bits [3:2] = 10, it indicates memory 3;<br>When bits [3:2] = 11, it indicates memory 4. |
| 1:0 | These two bits indicate which element of the corresponding entry in the erasure table to be written on the next write.<br>When bits [1:0] = 00, it indicates E1;<br>When bits [1:0] = 01, it indicates E2;<br>When bits [1:0] = 10, it indicates E3;<br>When bits [1:0] = 11, it indicates E4. |

FIG. 7 depicts an erasure generator 600 according to an embodiment of the invention. The erasure generator mainly consists of 16 comparators CMP 612 with indices from 0 to 15, a selection unit SEL 614, an erasure level buffer 616 and erasure assignment logic 618. It takes 256 cycles for the erasure generator to produce the 255 erasure bits used for decoding a codeword. Note that the index of the comparator is significant in determining the output of the erasure generator.

At each cycle, a comparator, say CMP n (0 to 15) takes an element from an entry in the erasure table. Another input of the comparator is the row number of the current codeword. The entry is taken from the erasure table in sequential order. That is, at the first cycle, entry 1 of the erasure table is taken and processed; at the second cycle, entry 2 is processed and so on; and at last, entry 255 is processed. At each cycle, the comparator generates a flag and erasure level. The following describes how these two outputs are determined.

Each element is a 3-tuple as follows:
(start_row, length, erasure level)

The comparator checks if the row number of the erasure generator input is between start_row and start_row+length. If yes, the comparator sets its output erasure level=the erasure level of the element and its output flag=1. Otherwise, set flag=0.

The selection unit 614 takes 16 pairs of flags and erasure levels and generates an erasure level output per cycle. If all flags from the comparators are 0, the selection unit outputs an erasure level 00b. Otherwise, the selection unit chooses the erasure level from the output of the comparator that has the highest index and its flag is set to 1. The erasure level output of the selection unit is buffered in a shift register.

After 255 iterative cycles, the 255 erasure levels are all stored in the shift registers in buffer 616. The erasure assignment logic then takes the erasure levels and translates them into binary erasure values. The following describes the translation.

1. If the erasure level=00b, the erasure value is assigned to 0;
2. If the erasure level=11b, the erasure value is assigned to 1;
3. If the erasure level=01 or 10, then if the total number of 1 is less than the programmed value (up to 64), the erasure value is assigned to 1. Otherwise, the erasure value is assigned to 0.

The erasure buffer 616 is composed of an array of 255 flip-flops, each of which stores 1 bit of erasure information. When the erasure bit is 0, it indicates that the current code byte is reliable (not an erasure); otherwise, it indicates that the current code byte is not reliable (an erasure).

Before the Reed-Solomon decoder starts to decode the codeword, the erasure generates the erasure bits and stores them in the erasure buffer. When decoding starts, the erasure buffer shifts out the value of the flip-flops and provides an erasure bit for each corresponding application code byte in the codeword.

As an example of memory savings, a scenario is provided to calculate the size of the memory required for the erasure table and determine the memory saving using an embodiment of the invention.

A conventional memory size for the erasure table is 255×1024×2=522240 bits=510 Kbits.

Using the invention, the memory size is 255×16×20 bits=81600 bits=79.68 Kbits.

The memory saving is: 522240−81600=440640 bits=430 K bits. That translates to 84.375% saving.

TABLE 5

Summaries our calculation - Comparison of memory requirement for the erasure table.

| | |
|---|---|
| Memory required if not using our invention | 510K bits |
| Memory required if using our invention | 79.68K bits |
| Memory reduction using our invention | 430K bits |

Advantages of the invention include improved signal reception and signal processing, and prolonged battery life in mobile wireless devices.

Having disclosed exemplary embodiments and the best mode, modifications and variations may be made to the disclosed embodiments while remaining within the subject and spirit of the invention as defined by the following claims.

What is claimed is:

1. A device supporting error correction, comprising:
a receiver configured to receive data over a communications link;
a decapsulator coupled to the receiver and configured to create datagrams and erasure attributes associated with the datagrams;
a decoder coupled to the decapsulator and configured to store the datagrams in a frame table and to create codewords, the decoder storing the datagrams in table columns to create table rows as codewords, selectively correcting the codewords based on the erasure attributes, and configured to store the erasure attributes in an erasure table that includes a plurality of entries, each entry being associated with a table column in the frame table and including a plurality of elements, each element including a plurality of fields that store the erasure attributes associated with the datagrams; and a user interface coupled to the decoder and configured to render images corresponding with corrected datagrams on the user interface.

2. The device of claim 1, wherein the decapsulator is configured to generate at least three levels of erasure attributes associated with the datagrams, and the erasure table elements are configured to store at least three levels of erasure attributes associated with the datagrams.

3. The device of claim 1, further comprising a pointer table configured to identify a location of an element of an entry in the erasure table.

4. The device of claim 1, further comprising an erasure generator including a plurality of comparators coupled to a selector, the erasure generator being connected to the erasure table and configured to generate an erasure assignment for each entry in the erasure table.

5. The device of claim 3, further comprising an erasure generator including a plurality of comparators coupled to a selector, the erasure generator being connected to the erasure table and configured to generate an erasure assignment for each entry in the erasure table.

6. The device of claim 1, wherein the communications link is a wireless link and the data is digital television data.

7. A method of processing error correction, comprising:
receiving data over a communications link;
decapsulating the data to create datagrams and erasure attributes associated with the datagrams;
decoding the datagrams by storing the datagrams in a frame table and creating codewords, the decoder storing the datagrams in table columns to create table rows as codewords, selectively correcting the codewords based on the erasure attributes, and storing the erasure attributes in an erasure table that includes a plurality of entries, each entry being associated with a table column in the frame table and including a plurality of elements, and each element including a plurality of fields that store the erasure attributes associated with the datagrams; and
rendering images corresponding with corrected datagrams on the user interface.

8. The method of claim 7, wherein decapsulating comprises generating at least three levels of erasure attributes associated with the datagrams, and the erasure table elements storing at least three levels of erasure attributes associated with the datagrams.

9. The method of claim 7, further comprising identifying a location of an element of an entry in the erasure table with a pointer table.

10. The method of claim 7, further comprising forming an erasure generator connected to the erasure table and configured to couple a plurality of comparators to a selector and to generate an erasure assignment for each entry in the erasure table.

11. The method of claim 9, further comprising forming an erasure generator connected to the erasure table and configured to couple a plurality of comparators to a selector and to generate an erasure assignment for each entry in the erasure table.

12. The method of claim 7, wherein the communications link is a wireless link and the data is digital television data.

* * * * *